(12) United States Patent
Okino et al.

(10) Patent No.: US 10,192,722 B2
(45) Date of Patent: Jan. 29, 2019

(54) PLASMA TREATMENT METHOD, PLASMA TREATMENT APPARATUS, AND PLASMA-TREATED LONG OBJECT

(71) Applicants: SUNLINE CO., LTD., Iwakuni-shi, Yamaguchi (JP); Hidekazu Miyahara, Tokyo (JP); Akitoshi Okino, Tokyo (JP)

(72) Inventors: Akitoshi Okino, Tokyo (JP); Hidekazu Miyahara, Tokyo (JP); Hidenobu Tsutsumi, Iwakuni (JP); Junji Nakazaki, Iwakuni (JP); Takashi Ogawa, Iwakuni (JP); Keita Suizu, Iwakuni (JP)

(73) Assignees: SUNLINE CO., LTD., Iwakuni-Shi (JP); Akitoshi Okino, Tokyo (JP); Hidekazu Miyahara, Tokyo (JP)

( * ) Notice: Subject to any disclaimer, the term of this patent is extended or adjusted under 35 U.S.C. 154(b) by 257 days.

(21) Appl. No.: 14/782,776

(22) PCT Filed: Apr. 8, 2013

(86) PCT No.: PCT/JP2013/060626
§ 371 (c)(1),
(2) Date: Oct. 6, 2015

(87) PCT Pub. No.: WO2014/167626
PCT Pub. Date: Oct. 16, 2014

(65) Prior Publication Data
US 2016/0071698 A1    Mar. 10, 2016

(51) Int. Cl.
*H01J 37/00* (2006.01)
*D01F 6/04* (2006.01)
*H05H 1/00* (2006.01)
*H01J 37/32* (2006.01)
(Continued)

(52) U.S. Cl.
CPC ............ *H01J 37/3277* (2013.01); *D01F 6/04* (2013.01); *D01F 6/12* (2013.01); *D01F 6/80* (2013.01);
(Continued)

(58) Field of Classification Search
CPC ............. H01J 37/3277; H01J 37/32348; H01J 37/32541; H01J 2237/327;
(Continued)

(56) References Cited

U.S. PATENT DOCUMENTS 3,746,858 A    7/1973  Pavlath et al.
4,625,092 A *  11/1986 Camacho ................. H05H 1/34
                                                  219/121.48
(Continued)

FOREIGN PATENT DOCUMENTS

JP    53119400 A    10/1978
JP    S6155430 A    7/1986
(Continued)

OTHER PUBLICATIONS

International Search Report (ISR) dated Aug. 6, 2013, issued for International application No. PCT/JP2013/060626.
(Continued)

*Primary Examiner* — Harold Y Pyon
*Assistant Examiner* — Danny N Kang
(74) *Attorney, Agent, or Firm* — Law Office of Katsuhiro Arai

(57) ABSTRACT

A plasma treatment method subjects a long object to be treated to plasma treatment by placing the long object to be treated in contact with plasma, the density distribution of which varies while selectively passing the long object to be treated through an area having high plasma density so that a surface of the long object can be thoroughly and uniformly subjected to plasma treatment. The method is applied to a
(Continued)

plasma treatment apparatus, and a plasma-treated long object can be obtained by the method.

12 Claims, 7 Drawing Sheets

(51) Int. Cl.
*D06M 10/02* (2006.01)
*H05H 1/24* (2006.01)
*D01F 6/12* (2006.01)
*D01F 6/80* (2006.01)

(52) U.S. Cl.
CPC .......... *D06M 10/02* (2013.01); *D06M 10/025* (2013.01); *H01J 37/32348* (2013.01); *H01J 37/32541* (2013.01); *H05H 1/2406* (2013.01); *H01J 2237/327* (2013.01); *H01J 2237/336* (2013.01); *H05H 2001/2462* (2013.01)

(58) Field of Classification Search
CPC ........ H01J 2237/336; D01F 6/04; D01F 6/12; D01F 6/80; D06M 10/02; D06M 10/025; H05H 1/2406; H05H 2001/2462
USPC ......................................................... 252/500
See application file for complete search history.

(56) References Cited

U.S. PATENT DOCUMENTS

| | | | |
|---|---|---|---|
| 6,417,511 B1 * | 7/2002 | Russ, IV | H01J 49/063 |
| | | | 250/292 |
| 7,411,353 B1 * | 8/2008 | Rutberg | H05H 1/44 |
| | | | 315/111.21 |
| 2006/0219754 A1 | 10/2006 | Clauberg et al. | |
| 2013/0084409 A1 * | 4/2013 | Vangeneugden | B29C 59/14 |
| | | | 427/569 |

FOREIGN PATENT DOCUMENTS

| | | | | | |
|---|---|---|---|---|---|
| JP | 6474942 | A | | 3/1989 | |
| JP | 1992048290 | U1 | | 4/1992 | |
| JP | 04-334543 | A | * | 11/1992 | |
| JP | 4334543 | A | | 11/1992 | |
| JP | 5148711 | A | | 6/1993 | |
| JP | 6182195 | A | | 7/1994 | |
| JP | 2004179191 | A | | 6/2004 | |
| JP | 2007162093 | A | | 6/2007 | |
| JP | 2008535251 | A | | 8/2008 | |
| JP | 2008305743 | A | | 12/2008 | |
| JP | 201397904 | A | | 5/2013 | |
| WO | 0150495 | A1 | | 7/2001 | |
| WO | WO 0150495 | A1 | * | 7/2001 | ........ H01J 37/32009 |
| WO | 2012004175 | A1 | | 1/2012 | |
| WO | WO 2012004175 | A1 | * | 1/2012 | ............ B29C 59/14 |

OTHER PUBLICATIONS

Supplementary European Search Report (SESR) dated Dec. 21, 2016, issued for European counterpart patent application No. EP13881565.

* cited by examiner

[Fig.1]
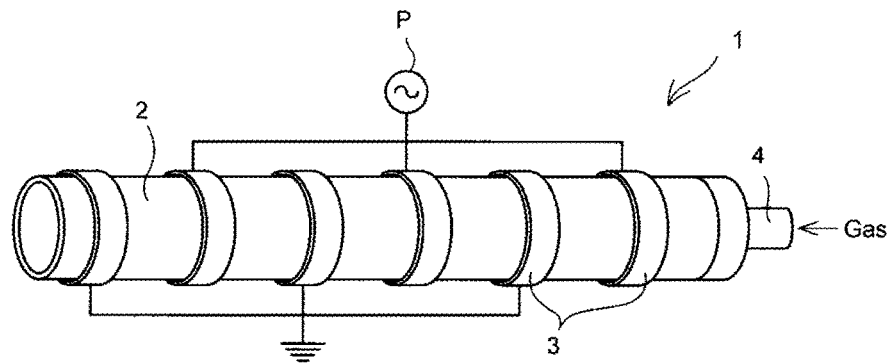
[Fig.2]
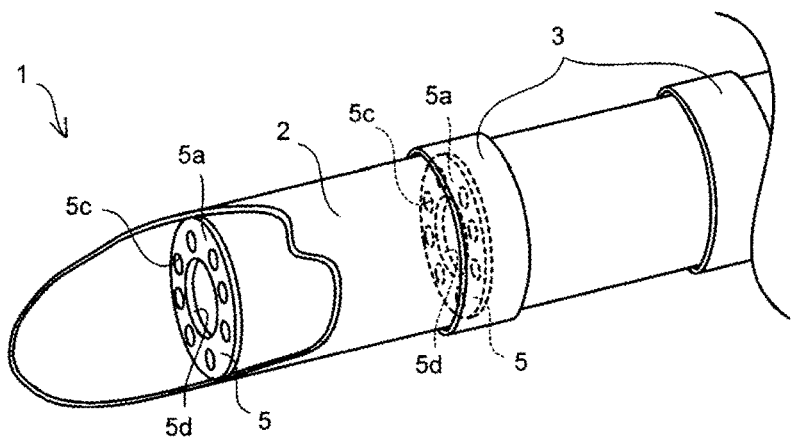
[Fig.3]
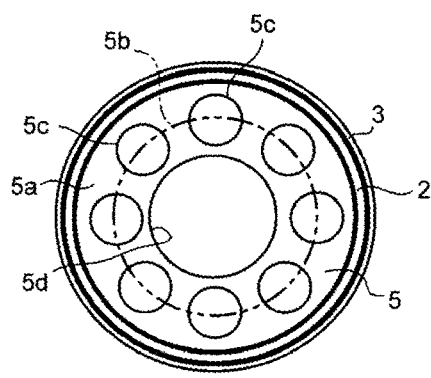

[Fig.4]
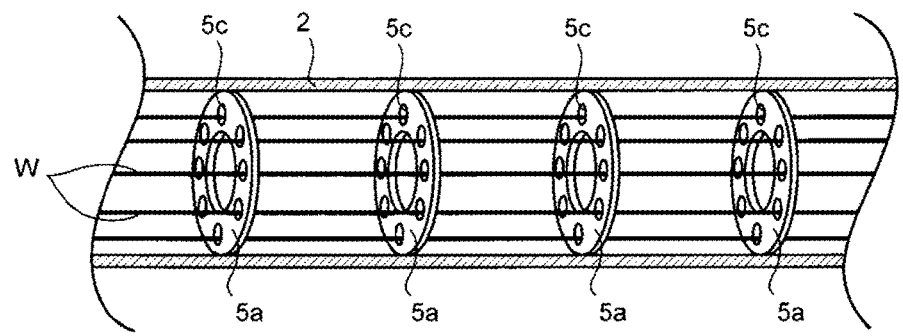
[Fig.5]
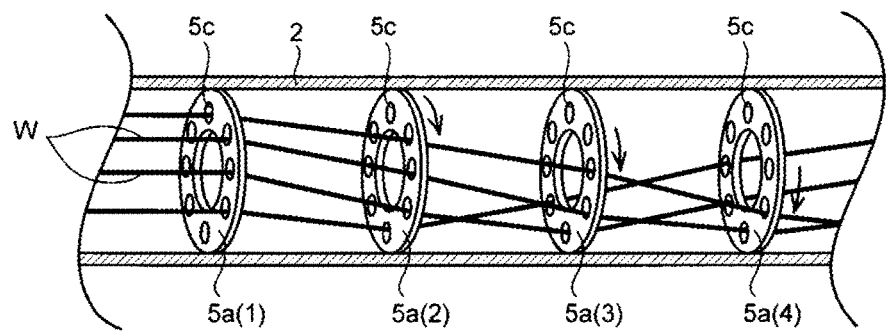
[Fig.6]
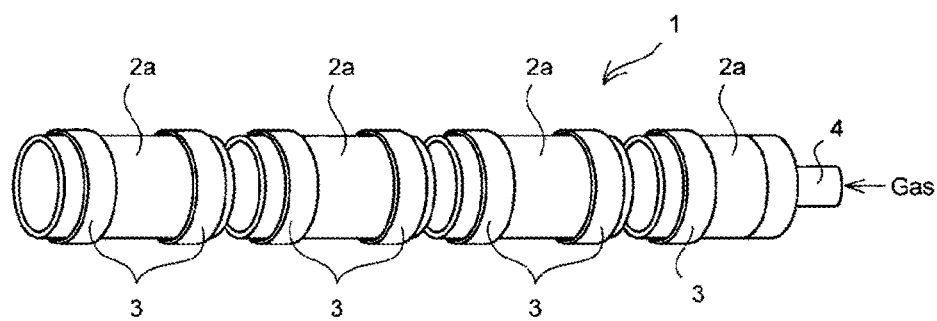

[Fig.7]
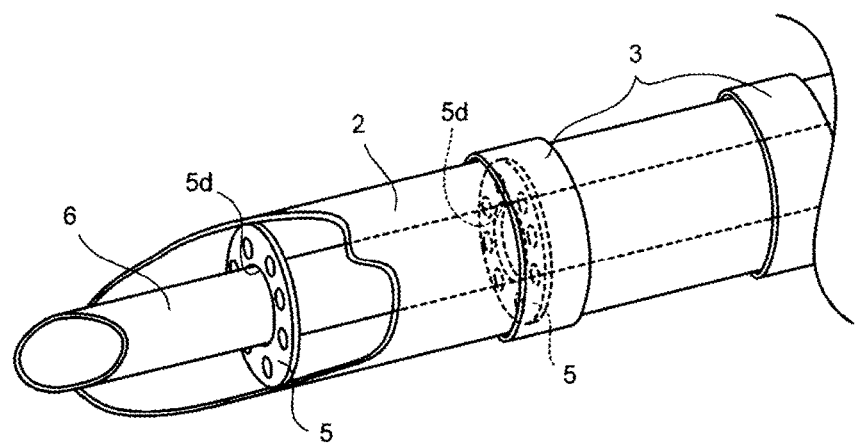
[Fig.8]
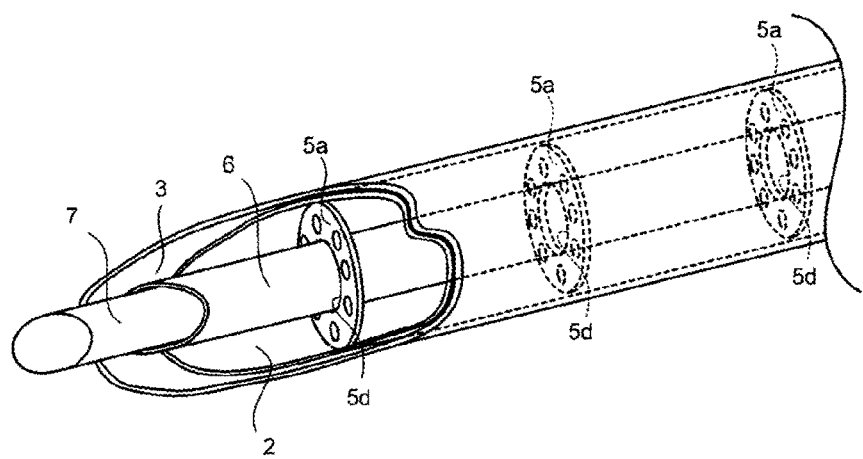

[Fig.9]
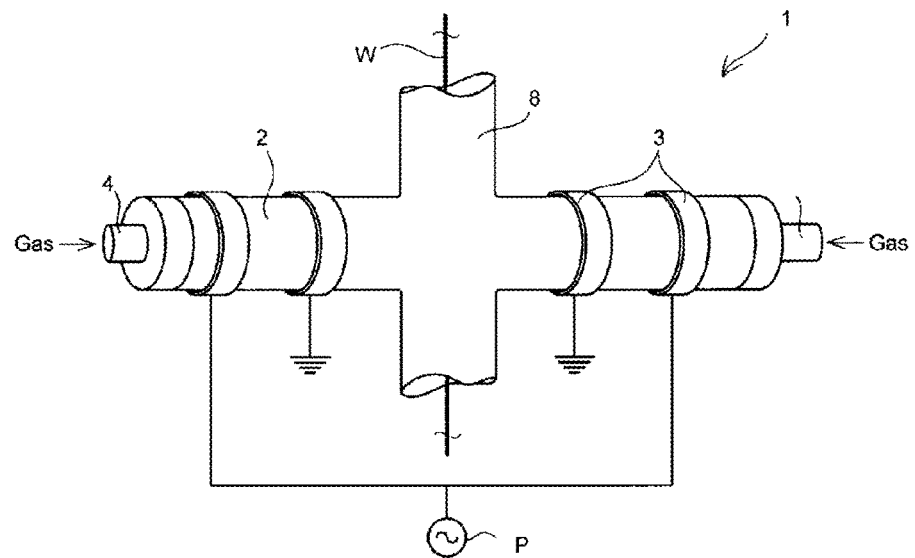
[Fig.10]
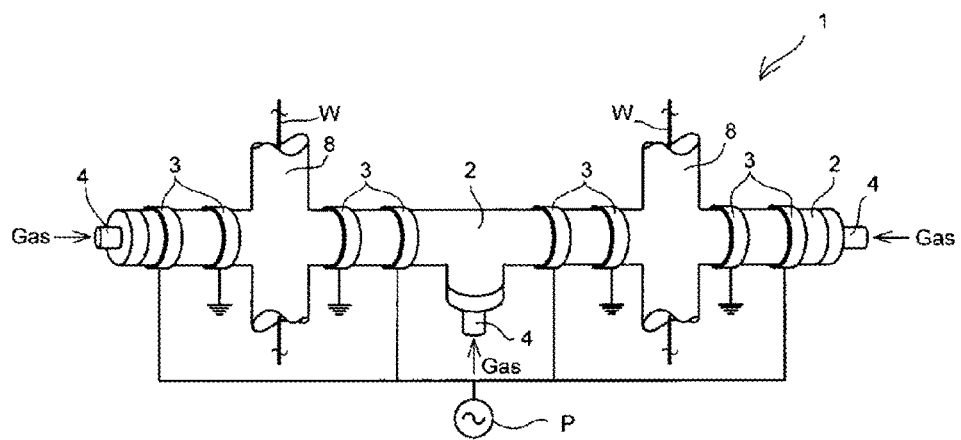

[Fig.11]
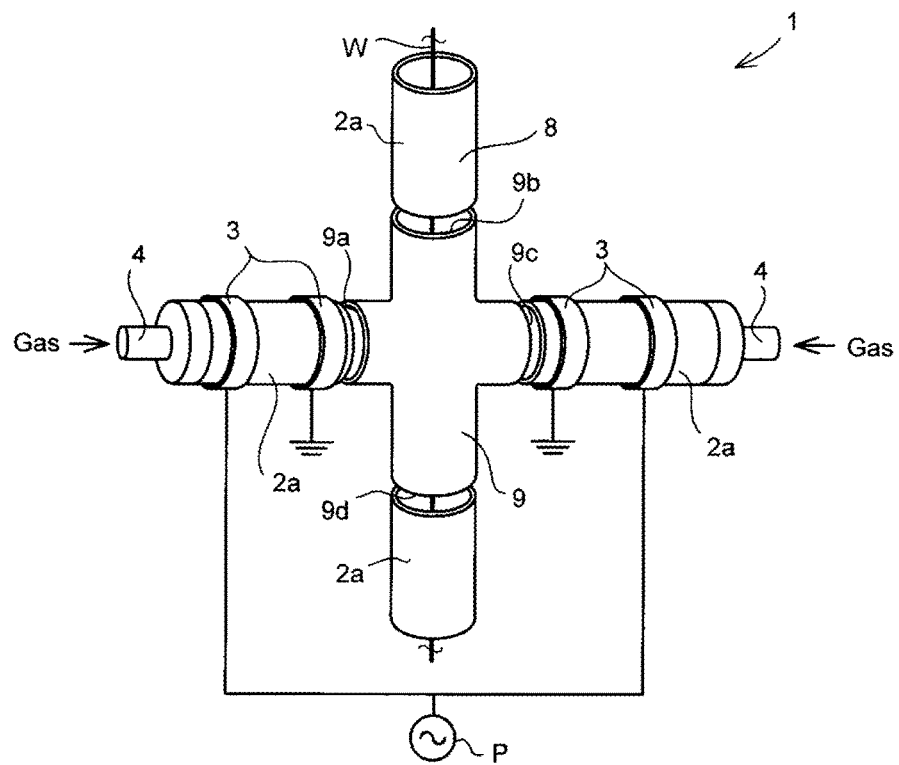
[Fig.12]
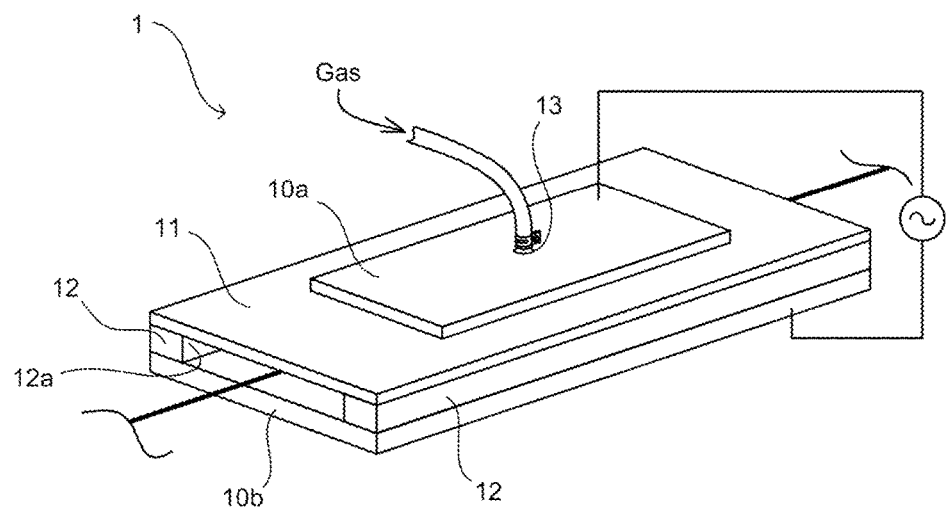

[Fig.13A]
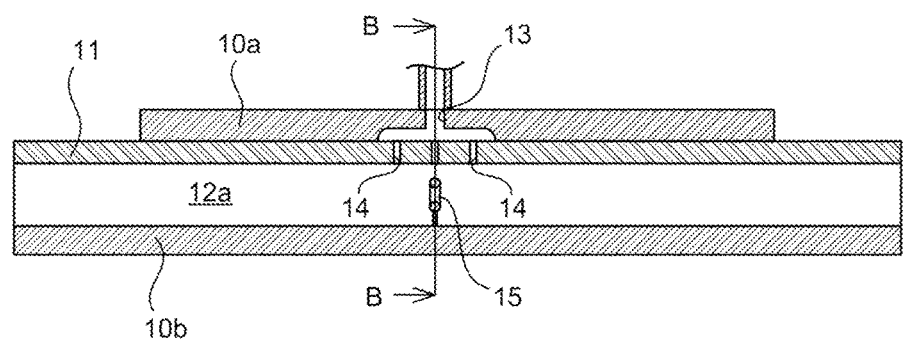
[Fig.13B]
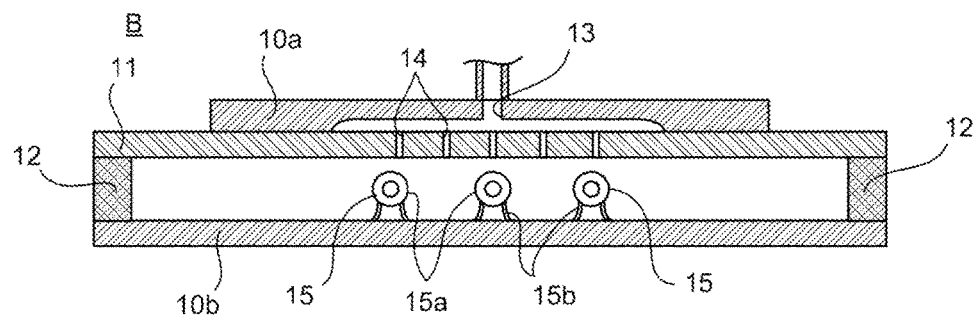

[Fig.14]
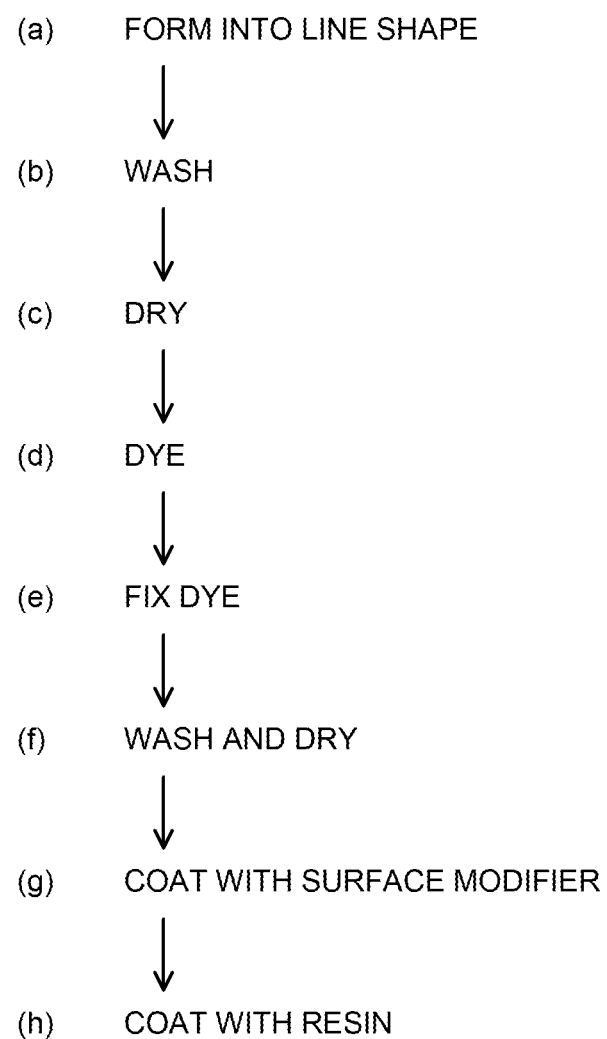

US 10,192,722 B2

PLASMA TREATMENT METHOD, PLASMA TREATMENT APPARATUS, AND PLASMA-TREATED LONG OBJECT

This application is the U.S. National Phase under 35 U.S.C. § 371 of International Application PCT/JP2013/060626, filed Apr. 8, 2013. The International Application was published under PCT Article 21(2) in a language other than English.

TECHNICAL FIELD

The present invention relates to a plasma treatment method in which a lengthy object to be treated is subjected to plasma treatment by being placed in contact with plasma, a plasma treatment apparatus, and a lengthy object that has been subjected to plasma treatment.

BACKGROUND ART

In recent years, there has been an increase in fishing lines that are surface-coated with colorful paints and resin materials that improve functionality, such as smoothness and flexibility of the line. Suppressing peeling of the paints and resin materials has become an issue.

As shown in FIG. 14, a manufacturing process of a fishing line that is coated with paint and resin involves, first, forming a resin pellet into a line shape at step (a). Next, at step (b), the line, which has yet to be dyed, is washed with an aqueous solution containing a surfactant to remove dirt and oil adhered to the surface thereof, and subsequently, at step (c), the line is dried to remove moisture attached thereto. Next, at step (d), the washed line is coated with a staining solution or immersed in a staining solution, and dyed. At step (e), the dyed line is heated to fix the dye, and the line is thereby painted.

In this manufacturing process, the wettability of the staining solution onto the line surface is improved by the washing at step (a) and the drying at step (b) being performed before the line is dyed.

Furthermore, after washing and drying is performed again at step (f), at step (g), the line is coated with a surface modifier to modify the surface thereof, and at step (h), the line is resin-coated to improve fishing line functionality.

Subjecting the surface of a base material to a modification treatment in this way is commonly practiced in the manufacturing process of fiber materials not limited to fishing lines. Various methods have been reported. Patent Literature 1 describes subjecting synthetic fibers and chemical fibers, as well as cloth, woven cloth, and non-woven cloth made from these fibers, to surface treatment using atmospheric pressure glow discharge plasma. An example described in Patent Literature 1 indicates that a surface of a polyester cloth is hydrophilized by the polyester cloth being subjected to atmospheric pressure glow discharge plasma treatment, and also discloses effects, such as facilitation of flexographic printing on the surface using water-based ink, achieved thereby.

Furthermore, a base material surface can be sterilized and cleaned by the base material being placed in contact with plasma, and various uses of this technique can be considered.

In addition, Patent Literature 2 describes an apparatus that is provided with a plurality of electrodes on an outer peripheral surface of a circular cylindrical tube. Glow discharge plasma is generated in the tube under atmospheric pressure by voltage being applied to the electrodes such as to induce electric potential difference in the length direction.

PRIOR ART LITERATURE

Patent Literature

Patent Literature 1: Japanese Patent Laid-open Publication No. Heisei 6-182195
Patent Literature 1: Japanese Patent Laid-open Publication No. Heisei 4-334543

DISCLOSURE OF INVENTION

Problem to be Solved by the Invention

However, although plasma treatment provides is extremely superior in terms of surface modification, the density distribution of plasma within a treatment chamber varies, and a certain amount of treatment time is required to evenly treat the surface of a lengthy, circular columnar object, such as fiber.

In addition, experiments conducted by the inventors of the present invention and the like, in which electrically conductive lines were subjected to plasma treatment using the apparatus described in Patent Literature 2, showed that abnormal discharge occurs between the electrodes and the electrically conductive line, and plasma is generated such as to swathe the electrically conductive line, making normal generation of plasma difficult. The experiments have revealed an issue in that plasma-treating an electrically conductive line using the apparatus described in Patent Literature 2 is difficult.

Furthermore, there is a high demand for technology enabling modification treatment of the surfaces of lengthy objects, such as fibers and tubes, in addition to fishing lines, and of fabrics composed of lengthy objects.

To solve these issues, an object of the present invention is to provide a plasma treatment method in which a lengthy object to be treated is subjected to plasma treatment at high speed by being selectively passed through an area having high plasma density, within plasma of which density distribution is varied, and that enables uniform and even surface treatment of the surface of the lengthy object to be treated, a plasma treatment apparatus that uses the plasma treatment method and has excellent operability, and a lengthy object that has been subjected to plasma treatment.

Means for Solving Problem

To achieve the above-described object, a plasma treatment method of the present invention is a plasma treatment method in which a lengthy object to be treated is subjected to plasma treatment by being placed in contact with plasma. The distribution density of plasma is varied within at least a cross-section that is perpendicular to a conveying direction of the lengthy object to be treated. A surface of the lengthy object to be treated is thoroughly and uniformly subjected to plasma treatment while being selectively passed through an area having high plasma density.

In the plasma treatment method of the present invention such as this, because the lengthy object to be treated is subjected to plasma treatment while being selectively passed through an area having high plasma density, plasma treatment can be performed efficiently. In addition, the occurrence of variations in treatment caused by differences in plasma density can be suppressed, and an even plasma treatment can be performed.

In addition, to achieve the above-described object, a first plasma treatment apparatus of the present invention includes: a first cylindrical portion in which plasma is generated therein; at least two or more ring-shaped electrodes that are provided in a longitudinal direction on an outer circumferential surface of the first cylindrical portion, and that generates plasma, the distribution density of which varies in a radial direction within the first cylindrical portion; a plasma generating gas introducing portion that introduces plasma generating gas into the first cylindrical portion; and a guide portion that is provided on the inner side of the first cylindrical portion and guides a lengthy object to be treated such as to advance through an area having high plasma density.

In the first plasma treatment apparatus of the present invention such as this, the plasma generating gas introducing portion introduces plasma generating gas into the first cylindrical portion, and electric potential difference is induced in the longitudinal direction between the ring-shaped electrodes. As a result, an area having high plasma density is formed within the first cylindrical portion, near the inner wall of the first cylindrical portion. The guide portion places the lengthy object to be treated in contact with plasma while advancing the lengthy object to be treated through such an area having high plasma density. Therefore, the lengthy object to be treated can be easily placed in contact with high-density plasma and subjected to plasma treatment.

In a second plasma treatment apparatus of the present invention, the guide portion is composed of a guide member of which a plurality is arranged in the longitudinal direction of the first cylindrical portion. The plurality of guide members are formed into a shape enabling the lengthy object to be treated to advance in a spiraling manner through the area having high plasma density in the first cylindrical portion.

In the second plasma treatment apparatus of the present invention such as this, the guide members guide the lengthy object to be treated such as to advance in a spiraling manner through the area having high plasma density. Therefore, the lengthy object to be treated can be advanced through the area having high plasma density while the surface thereof is uniformly exposed, and the surface of the lengthy object to be treated can be subjected to uniform and even plasma treatment. In addition, as a result of the lengthy object to be treated being advanced in a spiraling manner through the area having high plasma density, a high surface treatment effect can be achieved even at a short distance, compared to when the lengthy object to be treated is advanced in a linear manner. Therefore, the length of the first cylindrical portion can be shortened, and the apparatus itself can be reduced in size.

In a third plasma treatment apparatus of the present invention, the first cylindrical portion is formed by a plurality of unit cylinders being connected in the longitudinal direction.

In the third plasma treatment apparatus of the present invention such as this, when the lengthy object to be treated is set in the apparatus, the unit cylinders can be assembled such as to be connected to each other, after the lengthy object to be treated has been threaded through each unit cylinder. A plasma treatment apparatus having excellent operability can be achieved.

In a fourth plasma treatment apparatus of the present invention, a thin, cylindrical insulating tube is provided inside the first cylindrical portion. The insulating tube is disposed such as to pass through an area having low plasma density.

In the fourth plasma treatment apparatus of the present invention such as this, the flow of plasma generating gas into an area having low plasma density can be prevented by the insulating tube being passed through the area having low plasma density. Therefore, needless consumption of plasma generating gas can be suppressed, and running costs can be reduced.

In a fifth plasma treatment apparatus of the present invention a coolant is introduced into the insulating tube.

In the fifth plasma treatment apparatus of the present invention such as this, plasma generated within the first cylindrical portion can be cooled, and temperature rise in the plasma can be prevented. Therefore, even when, for example, a material that is easily affected by heat is used as the lengthy object to be treated, the material can be subjected to plasma treatment.

In a sixth plasma treatment apparatus of the present invention, the ring-shaped electrode is formed such as to cover the overall length of the outer circumferential surface of the first cylindrical portion. An electrically conductive material is introduced into the insulating tube.

In the sixth plasma treatment apparatus of the present invention such as this, electric potential difference is induced between the ring-shaped electrode and the electrically conductive material. Dielectric barrier discharge is generated, and plasma is thereby generated. Therefore, an area having a higher plasma density can be formed, and the lengthy object to be treated can be subjected to uniform and even plasma treatment at high speed.

In a seventh plasma treatment apparatus of the present invention, the electrically conductive material introduced into the insulating tube is an electrically conductive liquid.

In the seventh plasma treatment apparatus of the present invention such as this, a high degree of adhesion to the inner wall of the insulating tube can be achieved as a result of the electrically conductive material being an electrically conductive liquid. Therefore, dielectric barrier discharge can be efficiently generated.

In an eighth plasma treatment apparatus of the present invention, the electrically conductive liquid constantly flows within the insulating tube.

In the eighth plasma treatment apparatus of the present invention such as this, heat generated during plasma generation can be prevented from accumulating, and plasma can be cooled during power supply.

A ninth plasma treatment apparatus of the present invention includes a tank for storing the electrically conductive liquid. The conductive liquid circulates between the tank and the inside of the insulating tube such that the electrically conductive liquid is introduced into the insulating tube from the tank and led out from inside the insulating tube into the tank.

In the ninth plasma treatment apparatus of the present invention such as this, temperature rise in the plasma can be suppressed as a result of the electrically conductive liquid being circulated.

A tenth plasma treatment apparatus of the present invention includes at least a single second cylindrical portion that is integrally formed with the first cylindrical portion such as to perpendicularly pass through the first cylindrical portion.

In the tenth plasma treatment apparatus of the present invention such as this, as a result of the second cylindrical portion being provided, even when the lengthy object to be treated is composed of an electrically conductive material, the lengthy object to be treated can be passed through the second cylinder and placed in contact with plasma. Therefore, a lengthy object to be treated composed of an electrically conductive material can be efficiently subjected to plasma treatment.

In an eleventh plasma treatment apparatus of the present invention, the plasma generating gas introducing portion is provided on each of both end portions of the first cylindrical portion.

In the eleventh plasma treatment apparatus of the present invention such as this, plasma of a higher density can be introduced into the second cylinder as a result of both end portions of the first cylindrical portion being provided with the plasma generating gas introducing portion. The efficiency of plasma treatment performed on the lengthy object to be treated that passes through the second cylindrical portion can be improved.

In a twelfth plasma treatment apparatus of the present invention, the first cylindrical portion is formed by a plurality of unit cylinders being connected in the longitudinal direction. The section in which the first cylindrical portion and the second cylindrical portion intersect is connected by a cross-shaped connecting member.

In the twelfth plasma treatment apparatus of the present invention such as this, a plasma treatment apparatus having excellent operability can be achieved.

A thirteenth plasma treatment apparatus of the present invention includes: an upper electrode and a lower electrode that are plate-shaped, disposed such as to oppose each other, and generates plasma, the density of which is the highest near the center of an area in which the upper electrode and the lower electrode overlap as viewed in a planar view, and gradually becomes lower in an outer circumferential direction; an insulating plate that is disposed on the undersurface of the upper electrode, between the upper electrode and the lower electrode, such as to at least cover the overall undersurface of the upper electrode; a pair of spacers that are disposed in parallel with a conveying direction of the lengthy object to be treated and supports the insulating plate above the lower electrode in a state in which a predetermined gap is formed between the insulating plate and the lower electrode; and a guide portion that is provided in an area having high plasma density within the gap, that is at least a center portion in a conveying direction of the lengthy object to be treated, and that guides the lengthy object to be treated such as to advance through an area having high plasma density. A plasma generating gas introduction opening for introducing plasma generating gas into the gap is open on the inner surface on the gap side of at least either of the insulating plate and the lower electrode, in a position in which the upper electrode and the lower electrode oppose each other. The guide portion has a single or a plurality of holding portions that form a conveying path for the lengthy object to be treated. In addition, a fourteenth plasma treatment apparatus of the present invention includes a rotating apparatus that rotates the lengthy object to be treated such as to twist the conveyed lengthy object to be treated around a conveying-direction axis.

In the thirteenth plasma treatment apparatus of the present invention such as this, as a result of the lengthy object to be treated being placed in contact with plasma while being advanced through the area having high plasma density, the lengthy object to be treated can be easily placed in contact with high-density plasma and subjected to plasma treatment. In addition, in the fourteenth plasma treatment apparatus of the present invention, the surface of the lengthy object to be treated can be easily subjected to uniform and even surface treatment.

A first lengthy object of the present invention is a lengthy object that is composed of a fiber-shaped synthetic polymer compound and includes a surface that is subjected to plasma treatment by plasma treatment being performed thoroughly and uniformly on the surface using the plasma treatment method according to Embodiment 1. In addition, a second lengthy object of the present invention is a lengthy object that is composed of a fiber-shaped synthetic polymer compound, and includes a surface that is subjected to plasma treatment by the plasma treatment apparatus according to any one of Embodiments 2 to 10 and Embodiment 14, and Embodiment 15, which performs plasma treatment thoroughly and uniformly on the surface of the fiber-shaped synthetic polymer compound while selectively passing the fiber-shaped synthetic polymer compound through an area having high plasma density within a plasma, the density distribution of which varies at least within a cross-section that is perpendicular to a conveying direction of the fiber-shaped synthetic polymer compound. Furthermore, a third lengthy object of the present invention is a lengthy object that is composed of a fiber-shaped electrically conductive substance, and includes a surface that is subjected to plasma treatment by the plasma treatment apparatus according to any one of Embodiments 11 to 13, which performs plasma treatment thoroughly and uniformly on the surface of the fiber-shaped electrically conductive substance while selectively passing the fiber-shaped electrically conductive substance through an area having high plasma density within a plasma, the density distribution of which varies at lease within a cross-section that is perpendicular to a conveying direction of the fiber-shaped electrically conductive substance.

In the first to third lengthy objects of the present invention such as these, a lengthy object having a desired surface state, such as having high hydrophilic property, can be provided.

Effect of the Invention

In the plasma treatment method of the present invention, a lengthy object to be treated can be subjected to plasma treatment at high speed by being selectively passed through an area having high plasma density, within plasma of which the density distribution is varied, and uniform and even surface treatment can be performed on the surface of the lengthy object to be treated.

In addition, in the plasma treatment apparatus of the present invention, a plasma treatment apparatus having excellent operability can be provided.

Furthermore, in the plasma treatment apparatus of the present invention, even a lengthy object to be treated that is composed of an electrically conductive material can be subjected to effective plasma treatment.

Still further, a lengthy object that is subjected to desired surface modification can be obtained through use of the plasma treatment method and plasma treatment apparatus of the present invention.

BRIEF DESCRIPTION OF DRAWINGS

FIG. 1 is a schematic perspective view of a plasma treatment apparatus according to a first embodiment of the present embodiment.

FIG. 2 is a partially cutaway, enlarged perspective view of the plasma treatment apparatus of the present invention shown in FIG. 1.

FIG. 3 is a cross-sectional view of a main section of the plasma treatment apparatus of the present invention shown in FIG. 1.

FIG. 4 is a schematic cross-sectional view of a guide portion guiding a lengthy object to be treated in a linear manner.

FIG. 5 is a schematic cross-sectional view of the lengthy object to be treated being guided in a spiraling manner.

FIG. 6 is a perspective view of the plasma treatment apparatus of the present invention in which a first cylindrical portion is formed by unit cylinders being connected.

FIG. 7 is a partially cutaway, enlarged perspective view of the plasma treatment apparatus of the present invention in which an insulating tube is provided.

FIG. 8 is a partially cutaway, enlarged perspective view of a plasma treatment apparatus according to a second embodiment of the present invention.

FIG. 9 is a side view of a plasma treatment apparatus according to a third embodiment of the present invention.

FIG. 10 is a side view of the plasma treatment apparatus according to the third embodiment of the present invention in which a plurality of second cylindrical portions are provided.

FIG. 11 is a side view of the plasma treatment apparatus of the present invention in which the first cylindrical portion and the second cylindrical portion are formed by unit cylinders and a connecting member being connected.

FIG. 12 is a perspective view of a plasma treatment apparatus according to a fourth embodiment of the present invention.

FIG. 13 is cross-sectional views of the plasma treatment apparatus of the present invention shown in FIG. 12, in which (a) in FIG. 13 is a cross-sectional view in a longitudinal direction, and (b) in FIG. 13 is a cross-sectional view taken along B-B.

FIG. 14 is a flowchart of a manufacturing process of a fishing line.

BEST MODE(S) FOR CARRYING OUT THE INVENTION

Specific embodiments of a plasma treatment method and a plasma treatment apparatus of the present invention will be described with reference to FIG. 1 to FIG. 8.

The plasma treatment method of the present invention is a method in which a lengthy object to be treated is subjected to plasma treatment by being placed in contact with plasma. The density distribution of plasma varies. Therefore, the lengthy object to be treated is subjected to plasma treatment while being selectively passed through an area having high plasma density.

The lengthy object to be treated includes yarn composed of fiber, twine, braided rope, and the like, pipes, nanotubes, and combinations thereof. The lengthy object to be treated may be composed of any material, both inorganic and organic. In particular, the lengthy object to be treated is yarn composed of an inorganic material such as stainless steel, tungsten, or steel, or an organic material such as polyamide resin, fluorine-based resin, polyester resin, or polyolefin resin, a conjugated yarn thereof, and the like.

Specifically, the lengthy object to be treated is a monofilament or multifilament each composed of: a polyamide polymer such as nylon 6, nylon 66, nylon 12, and the like, or a copolymer thereof; a polyester polymer such as polyethylene terephthalate, polybutylene terephthalate, polyethylene naphthalate, polybutylene naphthalate, and the like, or a copolymer thereof; a polyolefin polymer such as polyethylene and polypropylene; a fluorine-based polymer such as polyvinylidene fluoride and polytetrafluoroethylene; an acrylic polymer having acrylonitrile in the main chain; a polyurethane-based polymer; and a polymer having a fiber forming property, such as polylactic acid. The lengthy object to be treated is also a spun yarn comprising cut fibers of the above monofilament or multifilament, combined filament yarn of the above spun yarn, or conjugated yarn such as blended yarn. The diameter of these fibers may be set to any diameter so long as defects, such as yarn breaking, does not occur within the apparatus.

A first embodiment of the plasma treatment apparatus of the present invention that uses the plasma treatment method of the present invention will be described.

As shown in FIG. 1, a plasma treatment apparatus 1 according to the first embodiment of the present invention includes: a first cylindrical portion 2 composed of a circular cylindrical tube; a ring-shaped electrode 3 to which power from a power supply P is applied, and of which at least two are provided in a longitudinal direction such as to be in close contact with the outer circumferential surface of the first cylindrical portion 2; and a plasma generating gas introducing portion 4 for introducing plasma generating gas into the first cylindrical portion 2. In the case in which the first cylindrical portion 2 is composed of the circular cylindrical tube as according to the present embodiment, when voltage inducing an electric potential difference in the longitudinal direction is applied to the ring-shaped electrodes 3 of which at least two are provided, such that the electric charges of adjacent ring-shaped electrodes 3 alternate in order between a positive charge and a negative charge, variation occurs in the density distribution of plasma inside the first cylindrical portion 2. The density of plasma is the highest near the inner wall where current density is high, and becomes lower towards the center portion in the radial direction. In addition, a uniform density distribution is present in the longitudinal direction of the first cylindrical portion 2.

As shown in FIG. 2, a guide portion 5 that is composed of a plurality of disk-shaped guide members 5a set in the longitudinal direction of the first cylindrical portion 2 is provided within the first cylindrical portion 2. As shown in FIG. 3, at least a single support hole 5c is formed in the guide member 5a in the area having high plasma density present within the first cylindrical portion 2, or in other words, near the inner wall of the first cylindrical portion 2, such as to perforate the guide member 5a in the thickness direction thereof. The center of the support hole 5c is located on a concentric circle 5b that has a smaller diameter than the guide member 5a. In addition, a through hole 5d is formed in the center portion of the guide member 5a.

When a lengthy object to be treated W is subjected to plasma treatment, as shown in FIG. 4, the lengthy object to be treated W is threaded through and supported by the support hole 5c, and guided to the area having high plasma density, that is, near the inner wall of the first cylindrical portion 2.

As a result of the plasma treatment apparatus 1 according to the first embodiment of the present invention, configured as described above, the surface of the lengthy object to be treated W can be placed in contact with high-density plasma and subjected to plasma treatment, even when plasma treatment is performed using plasma of which the density distribution is varied. Therefore, high-speed plasma treatment becomes possible In addition, as shown in FIG. 5, the guide members 5a may be provided such that respective support holes 5c form a predetermined angle with each other, in relation to the center axis in the longitudinal direction of the first cylindrical portion 2. The guide members 5a may be formed into a shape that, when the lengthy object to be treated W is threaded through and supported by each support hole 5c, guides the lengthy object to be treated W such as to advance through the area having high plasma density, that is, near the inner wall of the first cylindrical portion 2 in a spiraling manner.

As a result of the guide members 5a configured as described above, for example, when a second guide member 5a (2) is formed such as to be skewed by 45° in relation to a first guide member 5a (1) around the longitudinal-direction center axis of the first cylindrical portion 2, as a result of the lengthy object to be treated W being moved from the guide member 5a (1) to the guide member 5a (2), a portion of the outer circumferential surface of the lengthy object to be treated W that is skewed by 45° around the center axis from the position of the outer circumferential surface that is in contact with the high-density plasma at the guide member 5a (1) is placed in contact with the high-density plasma. Therefore, the overall outer circumferential surface of the lengthy object to be treated W can be placed in contact with high-density plasma as a result of the lengthy object to be treated W being threaded such as to advance in a spiraling manner by eight guide members 5a (1) to (8) that are disposed in the longitudinal direction of the first cylindrical portion 2 such that each is skewed by 45°. Consequently, the surface of the lengthy object to be treated W can be subjected to uniform and even surface treatment.

Furthermore, in a case in which the distance between the guide members 5a is the same, the distance in the longitudinal direction of the first cylindrical portion 2 required for the lengthy object to be treated W to make a single circuit around the inner circumferential surface of the first cylindrical portion 2 can be shortened by the skewing of the guide members 5a being increased. As a result, the plasma treatment apparatus 1 can be reduced in size. Specifically, whereas eight guide members 5a are required for a single circuit around the inner circumferential surface of the first cylindrical member 2 when the skewing is by 45°, only four guide members 5a are required for a single circuit around the inner circumferential surface of the first cylindrical member 2, when the skewing is by 90°. The length in the longitudinal direction of the first cylindrical member 2 can thereby be reduced by half or more.

In a state in which the lengthy object to be treated W is supported by the support holes 5c of the guide members 5a as shown in FIG. 4, each guide member 5a may be rotated by the predetermined angle to enable the lengthy object to be treated W to be advanced in a spiraling manner in the longitudinal direction of the first cylindrical portion 2.

In addition, as shown in FIG. 6, one first cylindrical portion 2 is formed by a number of cylinders 2a being connected. As a result of the first cylindrical portion 2 as described above, the first cylindrical portion 2 is formed by unit cylinders 2a being connected after the lengthy object to be treated W is threaded through the support holes 5c of the guide members 5a. Therefore, even when treatment is performed on a material having poor form stability as the lengthy object to be treated W, the material can be easily set and operability of the plasma treatment apparatus 1 can be improved. Furthermore, when the lengthy object to be treated W is advanced in a spiraling manner by rotating the guide members 5, the lengthy object to be treated W can be easily advanced in a spiraling manner by the unit cylinders 2a being connected such as to be skewed at an angle.

In addition, as shown in FIG. 7, a thin cylindrical insulating tube 6 is provided such as to be inserted into the space surrounding a circle-center axis of the first cylindrical portion, formed by the through holes 5d of the guide members 5a inside the first cylindrical portion 2. As a result of plasma being generated by introducing the plasma generation gas into only the space formed by the outer circumferential surface of the insulating tube 6 and the inner wall of the first cylindrical portion 2, the amount of plasma generating gas used can be suppressed, and running costs can be reduced.

Furthermore, as a result of a coolant, such as cool water, being introduced into the insulating tube 6, temperature rise in the plasma can be prevented. Therefore, even a lengthy object to be treated W that is easily affected by heat can be subjected to plasma treatment.

Next, a second embodiment of the plasma treatment apparatus 1 of the present invention will be described.

As shown in FIG. 8, according to the second embodiment of the present invention, as shown in FIG. 8, the ring-shaped electrode 3 is formed such as to cover the overall length of the outer circumferential surface of the first cylindrical portion 2, and an electrically conductive material 7 composed of a circular columnar copper rod is inserted into the insulating tube 6 such as to be in close contact with the inner wall of the insulating tube 6. At this time, in addition to the plasma generating gas being introduced into the space formed by the inner wall of the first cylindrical portion 2 and the outer circumferential surface of the insulating tube 6, power is applied to the ring-shaped electrode 3 and the electrically conductive material 7 using the power supply P. Voltage is applied such as to induce an electric potential difference in the radial direction of the first cylindrical portion 2 and dielectric barrier discharge is generated, thereby enabling plasma to be generated.

A plurality of guide members 5a are disposed in the longitudinal direction in the space formed by the inner wall of the first cylindrical portion 2 and the outer circumferential surface of the insulating tube 6, and within this space, supports and guides the lengthy object to be treated W.

According to the second embodiment, the electrically conductive material 7 is described as being a circular columnar copper rod. However, the degree of contact between the inner wall of the insulating tube 6 and the outer circumferential surface of the electrically conductive material 7 is important in order to efficiently generate discharge. Therefore, use of an electrically conductive liquid that is, for example, an aqueous electrolyte, such as aqueous sodium chloride or sea water, or mercury is more preferable. In this case, contact with the inner wall of the insulating tube 6 can be increased to a high degree, and dielectric barrier discharge can be efficiently generated.

In addition, a configuration is used in which the electrically conductive liquid is made to constantly flow within the insulating tube 6. For example, a tank that stores the electrically conductive liquid is preferably provided. The electrically conductive liquid is then circulated between the tank and the inside of the insulating tube 6 by being introduced into the insulating tube 6 from the tank and led out from inside the insulating tube 6 to the tank. As a result of the electrically conductive liquid being made to constantly flow, cooling can be performed during power supply, and workings as coolant can also be expected. The effects as a coolant can be further enhanced by the electrically conductive liquid being cooled within the tank or on the flow path.

As a result of the plasma treatment apparatus 1 according to the second embodiment, configured as described above, an area having higher plasma density can be formed, and the lengthy object to be treated W can be subjected to uniform and even plasma treatment at high speed.

<First Example>

An example using the plasma treatment method of the present invention will hereinafter be described.

The lengthy object to be treated W was subjected to plasma treatment using the plasma treatment apparatus 1 of the present invention, and the treatment effects thereof were examined.

As the lengthy object to be treated W, a polyamide monofilament having a diameter of 0.243 mm (a copolymer of nylon 6 and nylon 66 at 85/15), a polyvinylidene fluoride monofilament having a diameter of 0.268 mm, and a 400 denier/384 filament ultra high-molecular weight polyethylene fiber produced by combining four strands of 100 denier/69 filament ultra high-molecular weight polyethylene fiber were used.

<Sample Producing Method>

A detailed sample producing method will be described below.

The lengthy object to be treated W is set such as to be conveyed from an original yarn bobbin, around which the untreated lengthy object to be treated W is wound, to a take-up bobbin by two nip roller-attached yarn feed rolls set such as to be provided with a predetermined plasma treatment apparatus setup area (a setup area of about 1 meter was provided in the present example).

To clarify the treatment effects of the plasma treatment apparatus 1 of the present invention, in addition to the plasma treatment apparatus 1 of the present invention, a multi-gas plasma jet treatment apparatus (Multi-gas plasma manufactured by Plasma Concept Tokyo, Inc.) was used for comparison. Each apparatus was disposed in the plasma treatment apparatus setup area, and the lengthy object to be treated W was subjected to plasma treatment.

Aspects of each plasma treatment apparatus will be described.

An apparatus of the aspect shown in FIG. 1 was used as the plasma treatment apparatus 1 of the present invention. A plasma irradiation range of about 18 cm was formed in which a plurality of copper ring-shaped electrodes 3 were disposed at an interval of about 1 cm in the first cylindrical portion 2 composed of a glass tube having a diameter of 3 mm and a length of 1 m. The plasma generating gas introducing portion 4 for introducing the plasma generating gas is formed on one end side (right end in FIG. 1) of the first cylindrical portion 2. On the other end side of the first cylindrical portion 2, an adhesive film (not shown) is provided to narrow the opening, in order to suppress discharge of the plasma generating gas. Power is supplied to each of the plurality of ring-shaped electrodes 3 from a power supply unit, and voltage is applied such as to induce electric potential difference in the longitudinal direction of the first cylindrical portion 2.

The multi-gas plasma jet treatment apparatus used for comparison includes a plastic tube having a diameter of 8 mm and a length of 1 m, in which a plasma introduction opening is provided in substantially the center portion thereof in the longitudinal direction. Plasma is introduced into the plastic tube such as to flow in opposite directions towards both ends of the plastic tube, by a spray opening of a multi-gas plasma jet generating unit being connected to the plasma introduction opening.

Plasma treatment of an object to be treated is performed as follows. The lengthy object to be treated W that has been drawn out from the original yarn bobbin is introduced from one end portion of the plastic tube, and the treated lengthy object to be treated W is led out from the other end portion and taken up by the take-up bobbin. While the lengthy object to be treated W is conveyed from the original yarn bobbin to the take-up bobbin in this way at a predetermined conveyance speed, the surface of the lengthy object to be treated W is placed in contact with plasma inside the plastic tube.

As the plasma generating gas, argon gas, helium gas, oxygen gas, and carbon dioxide gas were used alone or in a mixed gas.

The sample used to measure the treatment effects is produced by winding the treated lengthy object to be treated W around the take-up bobbin in a single layer such that the yarn is arrayed without space between each turn. In the present example, a bobbin having a diameter of 50 mm and a winding width of 65 mm was used as the take-up bobbin.

<Contact Angle Measurement Method>

In addition, a method for measuring the contact angle of the sample will be described.

Portable contact angle analyzer PG-X manufactured by FIBRO system ab (Sweden) was used as the measurement apparatus. The measurement was performed as follows. The measurement apparatus was set above the yarn of the sample that is wound in an array. Pure water was dripped onto the yarn, and the contact angle between the arrayed row of yarn and pure water was detected. The contact angle indicates that the surface is hydrophilic as the value becomes lower, and indicates that the surface is water repellant as the value becomes higher.

First, the differences in treatment effects on each object to be treated, based on the type of gas, when the multi-gas plasma jet treatment apparatus is used was examined. The type of gas used in plasma treatment, gas flow rate, sample conveyance speed, and the contact angle results before and after treatment for each sample are indicated in Table 1. In Table 1, F1 denotes the polyamide monofilament, F2 denotes the polyvinylidene fluoride monofilament, and F3 denotes the ultra high-molecular weight polyethylene fiber

TABLE 1

| No. | Material | Gas type Primary gas (Volume %) | Gas type Secondary gas (Volume %) | Gas flow rate (L/min) | Conveyance speed (m/min) | Contact angle (Pre-treatment/post-treatment) (°) | Notes |
|---|---|---|---|---|---|---|---|
| 1 | F1 | Ar 100 | $O_2$ 1 | 10 | 5 | 81.7/0.0 | |
| 2 | F1 | He 100 | $CO_2$ 1 | 5 | 5 | 81.7/69.3 | |
| 3 | F1 | He 100 | $CO_2$ 1 | 10 | 5 | 81.7/0.0 | |
| 4 | F1 | He 100 | $O_2$ 1 | 5 | 5 | 81.7/67.7 | |
| 5 | F1 | He 100 | $O_2$ 1 | 10 | 5 | 81.7/85.7 | |

TABLE 1-continued

| | | Gas type | | | | Contact angle | |
| | | Primary gas | Secondary gas | Gas flow rate | Conveyance speed | (Pre-treatment/ post-treatment) | |
| No. | Material | (Volume %) | | (L/min) | (m/min) | (°) | Notes |
|---|---|---|---|---|---|---|---|
| 6 | F2 | Ar 100 | $O_2$ 1 | 10 | 5 | 91.7/99.9 | Water-repellent effect exhibited. |
| 7 | F2 | He 100 | $CO_2$ 1 | 10 | 5 | 91.7/77.2 | |
| 8 | F2 | He 100 | $O_2$ 1 | 10 | 5 | 91.7/96.3 | Water-repellent effect exhibited. |
| 9 | F3 | $CO_2$ 100 | — | 10 | 5 | 0.0/0.0 | Permeation in 1.30 seconds, before treatment. |
| 10 | F3 | Ar 100 | — | 10 | 5 | 0.0/0.0 | Immediate permeation after treatment. |

When the material is the polyamide monofilament, that is, F1, as indicated in No. 1 in Table 1, as a result of plasma treatment being performed using plasma generating gas in which 1 volume % oxygen gas is added to 100 volume % argon gas, the contact angle before treatment was 81.7°, whereas the contact angle after treatment was 0.0°. A high hydrophilic effect was achieved.

As indicated in No. 2 and No. 3, when plasma treatment was performed using plasma generating gas in which 1 volume % carbon dioxide gas is added to 100 volume % helium gas, in No. 2 in which the gas flow rate is 5 L/min, the contact angle before treatment was 81.7° and the contact angle after treatment was 69.3°. A slight hydrophilic effect was confirmed. In No. 3 in which the gas flow rate is 10 L/min, the contact angle before treatment was 81.7° and the contact angle after treatment was 0.0°. A high hydrophilic effect was confirmed.

As indicated in No. 4 and No. 5, when plasma treatment was performed using plasma generating gas in which 1 volume % oxygen gas is added to 100 volume % helium gas, in No. 4 in which the gas flow rate is 5 L/min, the contact angle before treatment was 81.7° and the contact angle after treatment was 67.7°. A slight hydrophilic effect was confirmed. In No. 5 in which the gas flow rate is 10 L/min, the contact angle before treatment was 81.7° and the contact angle after treatment was 85.7°. The results contrarily confirmed a water-repellent effect.

In addition, when the material is the polyvinylidene fluoride monofilament, that is, F2, as indicated in No. 6, as a result of plasma treatment being performed using plasma generating gas in which 1 volume % oxygen gas is added to 100 volume % argon gas, the contact angle before treatment was 91.7°, whereas the contact angle after treatment was 99.9°. The results indicate an increase in contact angle, and a water-repellent effect was achieved.

As indicated in No. 7, when plasma treatment was performed using plasma generating gas in which 1 volume % carbon dioxide gas is added to 100 volume % helium gas, the contact angle before treatment was 91.7° and the contact angle after treatment was 77.2°. A slight hydrophilic effect was confirmed.

Conversely, as indicated in No. 8, when plasma treatment was performed using plasma generating gas in which 1 volume % oxygen gas is added to 100 volume % helium gas, the contact angle before treatment was 91.7° and the contact angle after treatment was 96.3°. The contact angle increased, and the results confirmed a water-repellent effect.

In a similar manner, when the material is ultra high-molecular weight polyethylene fiber, that is, F3, hydrophilic property was exhibited before treatment, and pure water permeated the sample in about 1.30 seconds after dripping. As indicated in No. 9 and No. 10, as a result of plasma treatment being performed using plasma generating gas that is 100 volume % carbon dioxide gas and that is 100 volume % argon gas, the results indicated a hydrophilic property so high that pure water immediately permeated the sample.

Next, the contact angles when the polyamide monofilament (F1) and the polyvinylidene fluoride monofilament (F2) were subjected to plasma treatment using the plasma treatment apparatus of the present invention or the multi-gas plasma jet treatment apparatus used for comparison were measured. The treatment effects of the plasma treatment apparatus of the present invention were examined. The treatment apparatus used for treatment, the type of gas, gas flow rate, sample conveyance speed, and the contact angle results before and after treatment for each sample are indicated in Table 2.

TABLE 2

| | | | Gas type | | | | Contact angle | |
| | Treatment | | Primary gas | Secondary gas | Gas flow rate | Conveyance speed | (Pre-treatment/ post-treatment) | |
| No. | apparatus | Material | (Volume %) | | (L/min) | (m/min) | (°) | Notes |
|---|---|---|---|---|---|---|---|---|
| Ny1 | Present invention | F1 | Ar 100 | $O_2$ 1 | 10 | 10 | 81.7/0.0 | |
| Ny2 | Multi-jet type | F1 | Ar 100 | $O_2$ 1 | 10 | 10 | 81.7/0.0 | Variations in contact angle confirmed |
| FC1 | Present invention | F2 | He 100 | $O_2$ 1 | 10 | 5 | 91.7/0.0 | Immediate permeation |

TABLE 2-continued

| No. | Treatment apparatus | Material | Gas type Primary gas (Volume %) | Secondary gas (Volume %) | Gas flow rate (L/min) | Conveyance speed (m/min) | Contact angle (Pre-treatment/ post-treatment) (°) | Notes |
|---|---|---|---|---|---|---|---|---|
| FC2 | Multi-jet type | F2 | He 100 | O$_2$ 1 | 10 | 5 | 91.7/96.3 | |
| FC3 | Present invention | F2 | He 100 | O$_2$ 1 | 10 | 10 | 91.7/0.0 | Immediate permeation |
| FC4 | Present invention | F2 | He 100 | O$_2$ 1 | 10 | 20 | 91.7/75.1 | |

When the material is the polyamide monofilament, that is, F1, as indicated in No. Ny1 and No. Ny2, in both samples subjected to plasma treatment using the plasma treatment apparatus of the present invention and the multi-gas plasma jet treatment apparatus used for comparison, respectively, the contact angle before treatment was 81.7° and the contact angle after treatment was 0.0°. A hydrophilic effect was confirmed in both samples. However, in the sample subjected to treatment using the multi-gas plasma jet treatment apparatus used for comparison, variations in the contact angle of the water droplet were confirmed. Therefore, it is thought that the object to be treated was not subjected to uniform and even treatment. Conversely, in the sample in which the plasma treatment apparatus of the present invention was used, such variations in the contact angle of the water droplet were not confirmed. The surface of the object to be treated was subjected to uniform and even treatment.

In a similar manner, when the material is the polyvinylidene fluoride monofilament, that is, F2, as indicated in No. FC1 and No. FC2, in the sample subjected to plasma treatment using the plasma treatment apparatus of the present invention, the contact angle before treatment was 91.7° and the contact angle after treatment was 0.0°. A high hydrophilic effect was confirmed. Conversely, in the sample in which the multi-gas plasma jet treatment apparatus used for comparison was used, the contact angle before treatment was 91.7° and the contact angle after treatment was 96.3°. The results indicated an increase in the contact angle of the water droplet.

From the results above, it is clear that, through use of the plasma treatment apparatus of the present invention, an object to be treated can be subjected to uniform and even plasma treatment, and high surface-modification effects can be achieved.

In addition, to examine the treatment effects of the plasma treatment apparatus of the present invention using the polyvinylidene fluoride monofilament, that is, F2, as the material, the results of the contact angle of pure water to the sample when plasma treatment was performed with changes in the conveyance speed of the object to be treated will be described with reference to No. FC1, No. FC3, and No. FC4 in Table. 2.

When the conveyance speed was 5 m/min and 10 m/min, as indicated in No. FC1 and No. FC3, the contact angle before treatment was 91.7°, whereas the contact angle after treatment was 0.0°. A hydrophilic effect so high that pure water immediately permeates the sample was confirmed in both No. FC1 and No. FC3. When the conveyance speed was further increased and set to 20 m/min, as indicated in No. FC4, the contact angle before treatment was 91.7° and the contact angle after treatment was 75.1°. Although a slight hydrophilic effect was confirmed, surface modification was not to an extent enabling pure water to permeate the sample.

Based on these results, it is clear the surface modification effect increases as the irradiation time of plasma on the object to be treated increases.

In this way, through use of the plasma treatment apparatus of the present invention, a high surface-modification effect can be achieved on the lengthy object to be treated W. Furthermore, the surface of an object to be treated can be subjected to uniform and even plasma treatment.

In addition, a third embodiment of the plasma treatment apparatus 1 of the present invention will be described.

As shown in FIG. 9, according to the third embodiment of the present invention, plasma can be stably generated even when, for example, an electrically conductive lengthy object to be processed W composed of tungsten, steel, or the like is subjected to plasma treatment, and plasma treatment can be favorably performed. According to the third embodiment, at least a single second cylindrical portion 8 is provided that is formed integrally with the first cylindrical portion 2 such as to perpendicularly pass through the first cylindrical portion 2. Furthermore, in addition to the plasma generating gas being introduced into the first cylindrical portion 2 from the plasma generating gas introducing portion 4, voltage is applied to the ring-shaped electrodes 3 such as to induce electric potential difference in the longitudinal direction. As a result, plasma generated within the first cylindrical portion 2 is introduced into the second cylindrical portion 8.

As a result of the second cylindrical portion 8 being provided with a cock that opens and closes freely, a lengthy object to be treated can be subjected to plasma treatment in the first cylindrical portion 2.

At this time, as shown in FIG. 9, among the ring-electrodes 3, the ring-electrodes 3 disposed in positions adjacent to the second cylindrical portion 8 are preferably grounded. Even when an electrically conductive lengthy object to be treated W is threaded through the section at which the second cylindrical portion 8 and the first cylindrical portion 2 intersect, abnormal discharge does not occur because the adjacent ring-shaped electrodes 3 are in a grounded state. Plasma can be stably generated, and plasma can be introduced into the second cylindrical portion 8.

Furthermore, the plasma generating gas introducing portion 4 is preferably provided on each of both end portions of the first cylinder portion 2. The generated plasma is more easily introduced into the second cylindrical portion 8 by the flow of plasma generating gas introduced from both sides, and plasma of a higher density can be introduced into the second cylinder 8. Therefore, the lengthy object to be treated W can be subjected to plasma treatment at high speed.

In addition, as shown in FIG. 10, when a plurality of second cylindrical portions 8 are provided, the plasma generating gas introducing portion 4 for introducing plasma generating gas may be further provided between the second cylindrical portion 8 and the second cylindrical portion 8, at the center, such that a pair of ring-shaped electrodes 3 are provided on either side.

When gas, such as oxygen gas, carbon dioxide gas, or hydrogen gas, is added to the plasma generating gas to enhance the treatment effects, or when a deposition material is added for the purpose of chemical deposition, plasma treatment is preferably performed such that the plasma generating gas is directly introduced into the second cylindrical portion 8.

In addition, as shown in FIG. 11, when the first cylindrical portion 2 is formed by a plurality of unit cylinders 2a being connected in the longitudinal direction, a cross-shaped connecting member 9 is provided in the section in which the first cylindrical portion 2 and the second cylindrical portion 8 intersect. A pair of opposing opening portions 9a and 9c of the connecting member 9 are connected to the unit cylinders 2a to form the first cylindrical portion 2. Another pair of opposing opening portions 9b and 9d of the connecting member 9 form the second cylindrical portion 8. In this way, as a result of the plasma treatment apparatus 1 being formed by connecting the unit cylinders 2a and the connecting member 9, after the lengthy object to be treated W is threaded through the unit cylinders 2a and the connecting member 9, the unit cylinders 2a and the connecting member 9 can be connected and assembled into a state enabling plasma treatment, and plasma treatment can be performed. Therefore, a plasma treatment apparatus having excellent operability can be achieved.

As a result of the plasma treatment apparatus 1 according to the third embodiment of the present invention, configured as described above, the electrically conductive lengthy object to be treated W is threaded through the second cylindrical portion 8, and plasma generated in the first cylindrical portion 2 and the lengthy object to be treated W are placed in contact with each other within the second cylindrical portion 8. The lengthy object to be treated W is thereby subjected to plasma treatment. Therefore, abnormal discharge between the electrically conductive lengthy object to be treated W and the ring-shaped electrodes 3 can be suppressed. Plasma can be stably generated, and the electrically conductive lengthy object to be treated W can be easily subjected to plasma treatment.

In addition, a fourth embodiment of the plasma treatment apparatus 1 of the present invention will be described. As shown in FIG. 12, according to the fourth embodiment, the plasma treatment apparatus 1 includes: an upper electrode 10a and a lower electrode 10b that are plate-shaped, disposed such as to oppose each other, and to which power from the power supply P is applied; an insulating plate 11 disposed on the undersurface of the upper electrode 10a between the upper electrode 10a and the lower electrode 10b; a pair of spacers 12 that are disposed in parallel with the conveying direction of the lengthy object to be treated W and supports the insulating plate 11 above the lower electrode 10b in a state in which a predetermined gap 12a is formed between the insulating plate 12 and the lower electrode 10b; and a guide portion 5 that guides the lengthy object to be treated W between the gap 12a formed by the insulating plate 11 and the lower electrode 10b such as to advance through the area having high plasma density.

In addition, a plasma generating gas introduction opening 13 for introducing plasma generating gas is formed in the upper electrode 10a. A plurality of plasma generating gas spray openings 14 are formed in the insulating plate 11 such as to open towards the inner surface side of the gap 12a, to spray the plasma generating gas introduced from the plasma generating gas introduction opening 13 formed in the upper electrode 10a into the gap 12a formed between the insulating plate 11 and the lower electrode 10b.

In the plasma treatment apparatus 1 according to the fourth embodiment, as a result of power being applied from the power supply P to the upper electrode 10a and the lower electrode 10b in a state in which the plasma generating gas is introduced, dielectric barrier discharge is generated, and plasma is generated in the gap 12a formed by the insulating plate 11 and the lower electrode 10b.

In the plasma treatment apparatus 1 according to the fourth embodiment, configured as described above, plasma is formed such that the density is high within the gap 12a positioned near the center of the area in which the upper electrode 10a and the lower electrode 10b overlap, and becomes gradually lower from the center towards the outer circumferential direction.

Therefore, as shown in (a) in FIG. 13 and (b) in FIG. 13, the guide portion 5 is composed of guide members 15 that have a plurality of ring-shaped holding portions 15a that form the conveyance path of the lengthy object to be treated W and leg portions 15b that fix respective holding portions 15a to predetermined positions within the gap 12a. The guide portion 5 is disposed in the center in the longitudinal direction (the left/right direction on the surface of the paper on which the figure of (a) in FIG. 13 is printed) of the area in which the insulating plate 11 and the lower electrode 10b overlap, which center is at least substantially near the center of the area in which the upper electrode 10a and the lower electrode 10b overlap, such that the lengthy object to be treated W passes through the area having high plasma density.

The guide member 15 is not limited to that according to the present embodiment. For example, the guide member 15 can be formed in a variety of shapes, such as a thin plate in which a plurality of circular through holes are formed, a wedge-shaped thin film in which a half-moon shaped recessing portion is formed, or a circular tube. The holding portion 15b is also merely required to have a shape that can hold the lengthy object to be treated W, such as a U-shape or a Y-shape.

As a result of the plasma treatment apparatus 1 according to the fourth embodiment of the present invention, configured as described above, even when plasma treatment is performed using plasma of which the plasma density varies, the surface of the lengthy object to be treated W can be placed in contact with high density plasma and high-speed plasma treatment can be performed.

Furthermore, as a result of the lengthy object to be treated W being conveyed while being rotated such as to twist the lengthy object to be treated W around the conveying-direction axis, using a publically known rotating apparatus, the surface of the lengthy object to be treated W can be subjected to a uniform and even surface treatment.

In addition, the lengthy object subjected to plasma treatment using the plasma treatment apparatus 1 of the present invention has a very high affinity towards staining solutions and resin coatings. Fishing lines and fibers can be provide in which peeling hardly occurs in the paint and resin coating applied to the surface of the lengthy object. <Second Example>

The lengthy object to be treated W was subjected to plasma treatment using the plasma treatment apparatus 1 according to the fourth embodiment of the present invention and then coated with a surface treatment agent. The abrasion resistance effect of the surface treatment agent imparted by the plasma treatment was examined.

As the lengthy object to be treated W, a nylon monofilament having a circular cross-section and a diameter of 0.33 mm was used. Plasma treatment was performed in which the treatment conditions of the plasma treatment apparatus 1 was as follows: a gap 12a of 2 mm, an applied voltage of 35 kV, a frequency of 200 Hz, oxygen gas as the plasma generating gas, and a conveyance speed of the lengthy object to be treated W of 10 m/min. In addition, as the surface treatment agent, an emulsion solution having an amino-modified silicone concentration of 10% (MARPOSILCOAT EX-5G manufactured by Matsumoto Yushi-Seiyaku Co., Ltd.) was used.

Casting tests using a fishing rod were performed on sample A that was coated with the surface modifier after plasma treatment and sample B that was coated with the surface modifier without undergoing plasma treatment. The results of the measured contact angles of pure water to sample A and sample B after casting was performed 0 times, 50 times, 100 times, and 300 times, are indicated in Table 3.

TABLE 3

| Sample name | Plasma treatment | Contact angle (°) after casting | | | |
|---|---|---|---|---|---|
| | | 0 times | 50 times | 100 times | 300 times |
| Sample A | Treated | 110 | 94 | 90 | 94 |
| Sample B | Untreated | 107 | 62 | 62 | 60 |

As indicated in Table 3, when the casting test was performed 0 times, the contact angles were 110° and 107°, respectively, for sample A and sample B, indicating very superior water repellency. As a result, it is clear that in both sample A and sample B, the surface of the lengthy object to be treated W is evenly coated with the surface modifier composed of water repellent resin.

Regarding sample A that was coated with the surface modifier after plasma treatment, after the casting tests, the contact angle was 94° after casting was performed 50 times, the contact angle was 90° after casting was performed 100 times, and the contact angle was 94° after casting was performed 300 times. Although water repellency degraded slightly as a result of casting, excellent water repellency was maintained.

In addition, regarding sample B that was coated with the surface modifier without undergoing plasma treatment, the contact angle was 62° after casting was performed 50 times, the contact angle was 62° after casting was performed 100 times, and the contact angle was 60° after casting was performed 300 times. It is clear that water repellency was significantly lost, in comparison with sample A.

The results is indicate that the surface modifier applied to the surface of the lengthy object to be treated W wears off or peels as a result of friction during casting. It has become clear that, as a result of plasma treatment being performed using the plasma treatment apparatus 1 of the present invention before coating with the surface modifier, the adhesion between the lengthy object to be treated W and the surface modifier significantly improves.

In addition, in sample A that was coated with the surface modifier after plasma treatment, smoothness and water repellency of the yarn were not lost even when casting was repeatedly performed. It was found that a favorable sense of use, such as an excellent sense of release during casting, can be achieved.

The plasma treatment apparatus of the present invention is not limited to those according to the first to fourth embodiments. Various modifications are possible without departing from the features of the present invention. For example, according to the first embodiment and the second embodiment, the guide member 5a is described as being shaped such that a plurality of supporting holes 5c are formed in a circular disk. However, the guide member 5a may be formed such as to guide the lengthy object to be treated W by an existing ceramic yarn guide that is snail-shaped, dog tail-shaped, or loop-shaped being set in the circular circumferential portion of the inner wall of the first cylindrical portion 2.

In addition, for example, according to the fourth embodiment, the plasma generating gas introduction opening 13 may be formed in the lower electrode 10b, and the plasma generating gas may be introduced from the lower electrode 10b side into the gap 12a. Alternatively, the plasma generating gas introduction opening 13 for introducing plasma generating gas may be formed such as to be open on the inner walls of the insulating plate 11 and the lower electrode 10b on the gap 12 side. The plasma generating gas may thereby be introduced from both the upper electrode 10a side and the lower electrode 10b side.

EXPLANATIONS OF LETTERS OR NUMERALS 1 plasma treatment apparatus
2 first cylindrical portion
2a unit cylinder
3 ring-shaped electrode
4 plasma generating gas introducing portion
5 guide portion
5a guide member
5b concentric circle
5c support hole
5d through hole
6 insulating tube
7 electrically conductive material
8 second cylindrical portion
9 connecting member
9a, 9b, 9c, 9d opening portion
10a upper electrode
10b lower electrode
11 insulating plate
12a spacer
12a gap
13 plasma generating gas introduction opening
15 guide member
15a holding portion
W lengthy object to be treated
P power supply

The invention claimed is:

1. A plasma treatment apparatus in which a lengthy object to be treat is subjected to plasma treatment by being placed in contact with plasma comprising:
   a first cylindrical portion in which plasma is generated therein;
   two or more ring-shaped electrodes provided interspatially in a longitudinal direction, each of the ring-shaped electrodes surrounding the entire circumference of the first cylindrical portion, which electrodes generate plasma, distribution of plasma density varying in a radial direction within the first cylindrical portion wherein the plasma density is higher than the plasma density towards the center near an inner wall of the first cylindrical portion and the plasma density becomes lower towards a center in the radial direction in the first cylindrical portion;

a plasma generating gas introducing portion that introduces plasma generating gas into the first cylindrical portion; and a guide portion that is provided on the inner side of the first cylindrical portion, guides the lengthy object to be treated in a manner advancing through an area near the inner having high plasma density relative to the plasma density towards the center in the radial direction in the first cylindrical portion, and is composed of a plurality of guide members which are arranged in the longitudinal direction of the first cylindrical portion, wherein the plurality of guide members are formed into a shape enabling the lengthy object to be treated to advance in a spiraling manner through the area having high plasma density in the first cylindrical portion.

2. The plasma treatment apparatus according to claim 1, wherein:

the first cylindrical portion is formed by a plurality of unit cylinders being connected in the longitudinal direction.

3. The plasma treatment apparatus according to claim 1, wherein:

a thin, cylindrical insulating tube is provided inside the first cylindrical portion; and the insulating tube is disposed such as to pass through an area having low plasma density.

4. The plasma treatment apparatus according to claim 3, wherein:

a coolant is introduced into the insulating tube.

5. The plasma treatment apparatus according to claim 3, wherein:

the ring-shaped electrode is formed such as to cover the overall length of the outer circumferential surface of the first cylindrical portion; and an electrically conductive material is introduced into the insulating tube.

6. The plasma treatment apparatus according to claim 5, wherein:

the electrically conductive material introduced into the insulating tube is an electrically conductive liquid.

7. The plasma treatment apparatus according to claim 6, wherein:

the electrically conductive liquid constantly flows within the insulating tube.

8. The plasma treatment apparatus according to claim 6, comprising:

a tank for storing the electrically conductive liquid, wherein the conductive liquid circulates between the tank and the inside of the insulating tube such that the electrically conductive liquid is introduced into the insulating tube from the tank and led out from inside the insulating tube into the tank.

9. The plasma treatment apparatus according to claim 1, comprising:

at least a single second cylindrical portion that is integrally formed with the first cylindrical portion such as to perpendicularly pass through the first cylindrical portion.

10. The plasma treatment apparatus according to claim 9, wherein:

the plasma generating gas introducing portion is provided on each of both end portions of the first cylindrical portion.

11. The plasma treatment apparatus according to claim 9 wherein:

the first cylindrical portion is formed by a plurality of unit cylinders being connected in the longitudinal direction; and the section in which the first cylindrical portion and the second cylindrical portion intersect is connected by a cross-shaped connecting member.

12. A plasma treatment apparatus comprising:

an upper electrode and a lower electrode that are plate-shaped and disposed such as to oppose each other, generates plasma, the density of which is the highest near the center of an area in which the upper electrode and the lower electrode overlap as viewed in a planar view, and gradually becomes lower in an outer circumferential direction;

an insulating plate that is disposed on the undersurface of the upper electrode, between the upper electrode and the lower electrode, such as to at least cover the overall undersurface of the upper electrode;

a pair of spacers that are disposed in parallel with a conveying direction of the lengthy object to be treated and supports the insulating plate above the lower electrode in a state in which a predetermined gap is formed between the insulating plate and the lower electrode;

a guide portion that is provided in an area having high plasma density within the gap, which area is at least a center portion in a conveying direction of the lengthy object to be treated, and that guides the lengthy object to be treated in the gap, such as to advance through an area having high plasma density, and a rotating apparatus that rotates the lengthy object to be treated in a manner twisting the conveyed lengthy object to be treated around a conveying-direction axis, wherein a plasma generating gas introduction opening for introducing plasma generating gas into the gap is open on the inner surface on the gap side of at least either of the insulating plate and the lower electrode, in a position in which the upper electrode and the lower electrode oppose each other, and the guide portion has a single holding portion or a plurality of holding portions that form(s) a conveying path for the lengthy object to be treated.

* * * * *